(12) United States Patent
Gruss et al.

(10) Patent No.: US 7,802,437 B2
(45) Date of Patent: Sep. 28, 2010

(54) ELECTRONIC COMPONENT WITH HEAT TRANSFER BY BOILING AND CONDENSATION AND METHOD FOR PRODUCING SAME

(75) Inventors: Jean-Antoine Gruss, Seyssinet-Pariset (FR); Marc Plissonnier, Eybens (FR)

(73) Assignee: Commissariat a l'Energie Atomique, Paris (FR)

( * ) Notice: Subject to any disclaimer, the term of this patent is extended or adjusted under 35 U.S.C. 154(b) by 385 days.

(21) Appl. No.: 11/826,294

(22) Filed: Jul. 13, 2007

(65) Prior Publication Data

US 2008/0017356 A1 Jan. 24, 2008

(30) Foreign Application Priority Data

Jul. 20, 2006 (FR) ................... 06 06615

(51) Int. Cl.
*F25D 21/02* (2006.01)
*G01N 21/00* (2006.01)
*H01L 35/30* (2006.01)

(52) U.S. Cl. ............... 62/3.7; 436/49; 136/205

(58) Field of Classification Search ............... 62/3.7, 62/33, 37; 250/336.1, 338, 338.1; 136/200, 136/204, 205, 208, 236.1, 256; 165/185, 165/133, 104.26, 104.33; 257/9, 14, E29.242, 257/750, 714; 438/2, 99, 399, 551; 29/846; 977/723; 427/97.4; 825/813; 833/832; 855/849; 813/700; 798/797; 796/795; 785/778; 784/778; 773/700; 770/768; 767/766; 762/700; 356/301; 436/49

See application file for complete search history.

(56) References Cited

U.S. PATENT DOCUMENTS

| 6,880,346 | B1 | 4/2005 | Tseng et al. | |
|---|---|---|---|---|
| 2002/0175408 | A1* | 11/2002 | Majumdar et al. | 257/734 |
| 2004/0106203 | A1* | 6/2004 | Stasiak et al. | 436/49 |
| 2005/0006754 | A1 | 1/2005 | Arik et al. | |
| 2005/0126766 | A1 | 6/2005 | Lee et al. | |
| 2006/0008942 | A1* | 1/2006 | Romano et al. | 438/99 |
| 2006/0090885 | A1 | 5/2006 | Montgomery et al. | |
| 2006/0255452 | A1* | 11/2006 | Wang et al. | 257/714 |

OTHER PUBLICATIONS

Abramson, Alexis R. et al., "Fabrication and Characterization of a Nanowire/Polymer-Based Nanocomposite for a Prototype Thermoelectric Device," Journal of Microelectromechanical Systems, vol. 13, No. 3, p. 505-513 (Jun. 2004).
Honda, H. et al., "Enhanced Boiling Heat Transfer from Electronic Components by Use of Surface Microstructures," Experimental Thermal and Fluid Science, vol. 28, p. 159-169 (2004).
Riffat, S. B. et al., "Improving the Coefficient of Performance of Thermoelectric Cooling Systems: a Review," International Journal of Energy Research, vol. 28, p. 753-768 (2004).

* cited by examiner

*Primary Examiner*—Frantz F. Jules
*Assistant Examiner*—Emmanuel Duke
(74) *Attorney, Agent, or Firm*—Oliff & Berridge, PLC

(57) ABSTRACT

The electronic component with heat transfer by boiling and condensation comprises heat exchange surfaces immersed in a heat conducting fluid constituted by the free ends of nanowires of a thermoelectric converter. An electrically insulating coating material with a low thermal conduction partially covers the nanowires above the heat conducting fluid. Each nanowire forms a thermocouple composed of two coaxial branches made from materials of different natures separated by a layer of electrically insulating material and electrically connected individually to the free end of the nanowire.

6 Claims, 8 Drawing Sheets

ELECTRONIC COMPONENT WITH HEAT TRANSFER BY BOILING AND CONDENSATION AND METHOD FOR PRODUCING SAME

BACKGROUND OF THE INVENTION

The invention relates to an electronic component with heat transfer by boiling and condensation comprising heat exchange surfaces immersed in a heat conducting fluid, and a method for producing one such component.

STATE OF THE ART

As represented in FIG. 1, a cooling device can be formed by an electronic component, for example a thermoelectric converter 1, arranged on a component to be cooled constituting a heat source 2 and associated with a fin cooling assembly 3, possibly in forced convection by means of a fan 4.

Electronic components used as thermoelectric converters are conventionally formed by thermocouples (FIGS. 2 and 3) thermally connected in parallel between respectively hot and cold sources 5 and 6, each thermocouple being made up of two branches 7 and 8 made from metallic or semi-conducting materials of different natures (for example respectively of n-type and p-type) electrically connected in series. The heat flux passing through the thermoelectric converter is represented by vertical arrows in FIGS. 2 and 3.

Such a converter can be used to create a thermal gradient by Peltier effect, and thus to create a thermoelectric cooling effect when a current flows through the branches, as represented in FIG. 2. Reciprocally, it can be used to create an electric current by Seebeck effect when it is subjected to a thermal gradient between the hot and cold sources, as represented in FIG. 3.

The problem of thermal coupling arises in the same way in a Seebeck effect thermoelectric converter, in which the heat has to be removed at the level of the cold source to maintain the thermal gradient generating the electric current, as in a Peltier effect thermoelectric converter, in which the heat is rejected at the level of the cold source. Indeed, in both cases the same thermal resistance between the converter and the cold source, in general the ambient air, limits the amount of heat to be removed.

It has been proposed to use nanowires to improve the efficiency of thermoelectric converters using quantum confinement phenomena, in particular in the US patent application US2002/0175408 and in the article "Fabrication and Characterization of a Nanowire/Polymer-Based Nanocomposite for a Prototype Thermoelectric Device", by Alexis R. Abramson et al., in "Journal of Microelectromechanical Systems", pages 505-513, vol. 13, n°3, June 2004. In these documents, the nanowires are embedded in polymer matrices, for example made from parylene in the article, to form packets of nanowires all having the same composition, for example n-type or p-type semi-conductors, in any one packet. The nanowires of the same nature are then electrically connected in parallel within each packet and at least two packets of different natures are interconnected to form a thermoelectric converter.

Moreover, the use of heat pipes enables the equivalent thermal conductivity obtained by means of a full copper plate to be improved by a factor 100 to 1,000 and much better performances than those of a finned plate to be obtained. A heat pipe conventionally comes in the form of a hermetically sealed enclosure containing a fluid in equilibrium with its vapor phase, without any other gas. Heat transfer takes place passively by cycles in which the fluid evaporates on a hot part and condenses on a cold part, for example on a surface of the heat pipe externally covered by fins.

Heat pipes are currently used either in the form of coolers with added heat pipes or in the form of heat pipe chambers. The latter configuration presents less parts and less assemblies than added heat pipe coolers and minimizes the thermal resistance, in particular at the heat pipes/plates and fins interfaces.

The article "Enhanced boiling heat transfer from electronic components by use of surface microstructures", by Honda H and Wei J J, Experimental Thermal and Fluid Science, 28 (2004), p. 159-1659, reviews different works concerning enhancement of the boiling heat transfer coefficients for electronic components immersed in dielectric fluids, by the use of superficial microstructures. This article describes different surface structuring methods such as creation of surface roughnesses by sand blasting, chemical etching, porous deposition, creation of re-entrant cavities or micropillars by dry etching techniques conventionally used in microelectronics.

OBJECT OF THE INVENTION

The object of the invention is to improve the efficiency of an electronic component with heat transfer by boiling and condensation.

This object is achieved by a component according to the appended claims and more particularly by the fact that the heat exchange surfaces of the component are formed by free ends of nanowires of a thermoelectric converter comprising a plurality of nanowires formed on a base substrate, an electrically insulating coating material with low thermal conduction partially coating the nanowires being arranged between the base substrate and the heat conducting fluid, each nanowire forming a thermocouple formed by two coaxial branches made from materials of different natures separated by a layer of electrically insulating material and electrically connected individually to the free end of the nanowire.

It is a further object of the invention to provide a method for production of such a component, characterized in that it comprises:

formation of a thermoelectric converter comprising a plurality of nanowires on a base substrate, each nanowire forming a thermocouple formed by two coaxial branches made from materials of different natures, separated by a layer of electrically insulating material and electrically connected individually to the free end of the nanowire, partial impregnation of the nanowires by an electrically insulating coating material with low thermal conduction, and immersion of the free ends of the nanowires in a heat conducting fluid of a heat pipe.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PREFERRED EMBODIMENTS OF THE INVENTION

Figure 1:
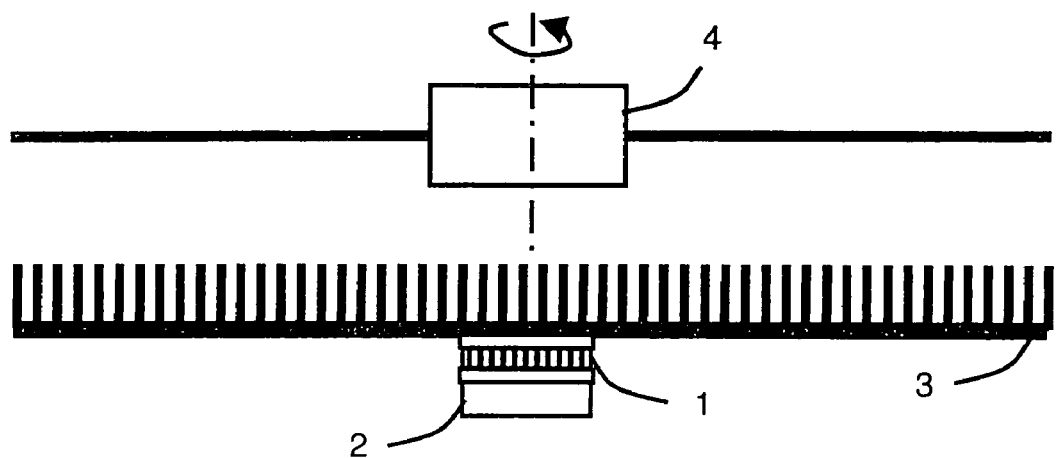
FIG. 1 schematically illustrates a cooling device according to the prior art.
Figure 2:
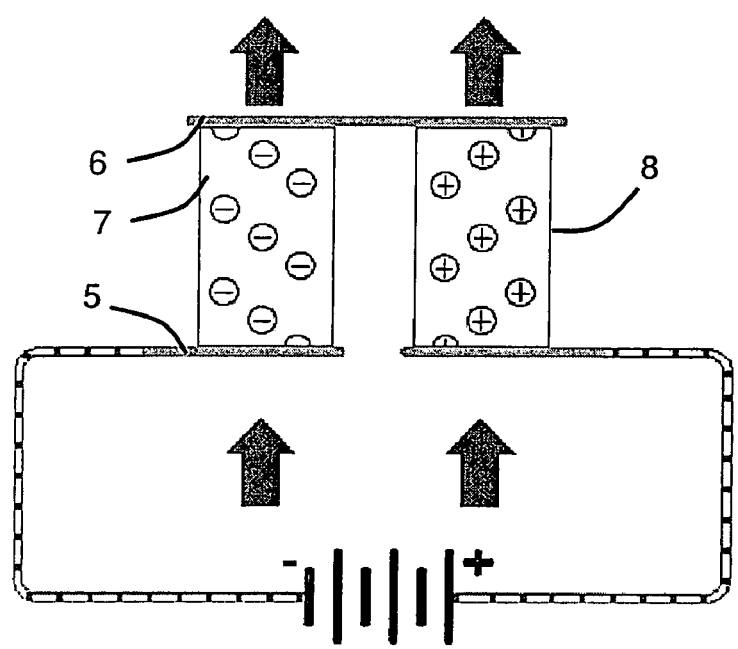
FIGS. 2 and 3 schematically illustrate the use of a thermoelectric converter according to the prior art respectively as a cooling device and as an electric generator.
Figure 3:
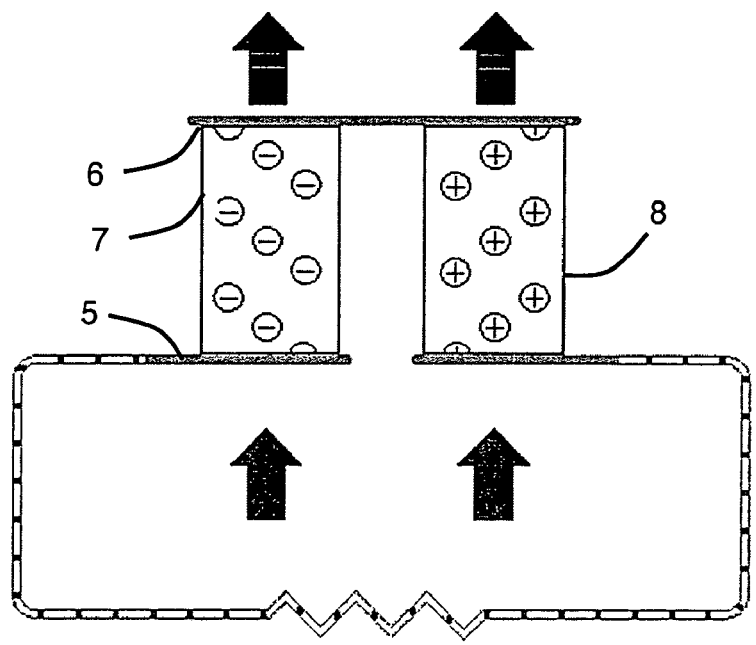
Figure 4:
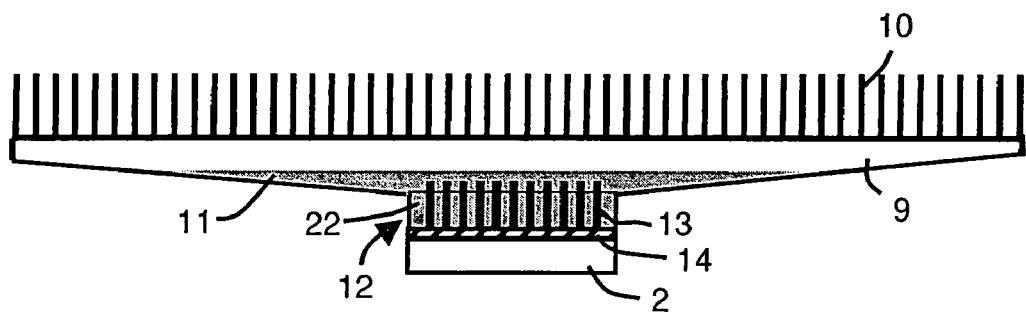
FIGS. 4 and 5 illustrate two alternative embodiments of a component according to the invention.
Figure 5:
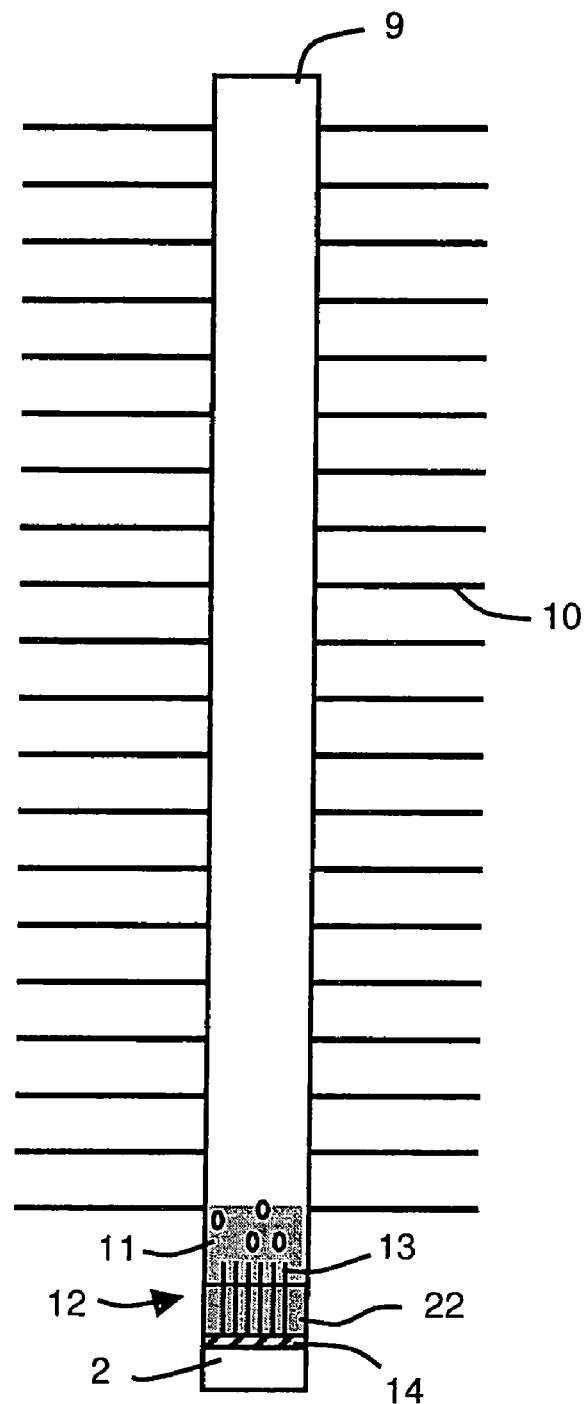

In the two alternative embodiments of the invention represented in FIGS. 4 and 5, heat transfer between the component 2 to be cooled and the ambient air is performed by a heat pipe 9, i.e. by means of a heat transfer by boiling and condensation taking place in a closed circuit with return of the fluid either by gravity or by capillarity. The heat pipe can have any suitable known configuration.

For example, the heat pipe 9 of FIG. 4 has the shape of an upwardly tapered chamber preferably presenting fins 10 on the external face of its top wall. The heat pipe 9 of FIG. 5 for its part is formed by a vertical cylindrical tube preferably comprising fins 10 on the external face of its side wall.

In FIGS. 4 and 5, the component 2 to be cooled constitutes the hot source of a nanowire-based thermoelectric converter comprising a plurality of nanowires 13 formed on a base substrate 14. The free ends of the nanowires reject the heat to the cold source constituted by the ambient air. However, thermal coupling of nanowire-based thermoelectric converters by contact between the end of the nanowires and a cooling plate or the internal surface of a heat pipe is problematic, in particular on account of the fragility of the nanowires, of the thermal contact resistance and electrical connections.

In FIGS. 4 and 5, the free ends of the nanowires 13 are used as heat exchange surfaces immersed in the coolant fluid 11 of the heat pipe 9. The nanowires thus perform both their function of thermoelectric generator and a function of improved heat exchange surface. However, known nanowire-based thermoelectric converters do not enable this twofold function, in particular due to the fact that the adjacent nanowires of the converter are electrically connected in series alternately at the level of the hot source (at their base) and at the level of the cold source (at their top part), two adjacent parallel nanowires of different natures thus forming a thermocouple.

To enable this twofold function, each nanowire forms a thermocouple composed of two coaxial branches made from materials of different natures separated by a layer of electrically insulating material and electrically connected individually to the free end of the nanowire.

Figure 6:
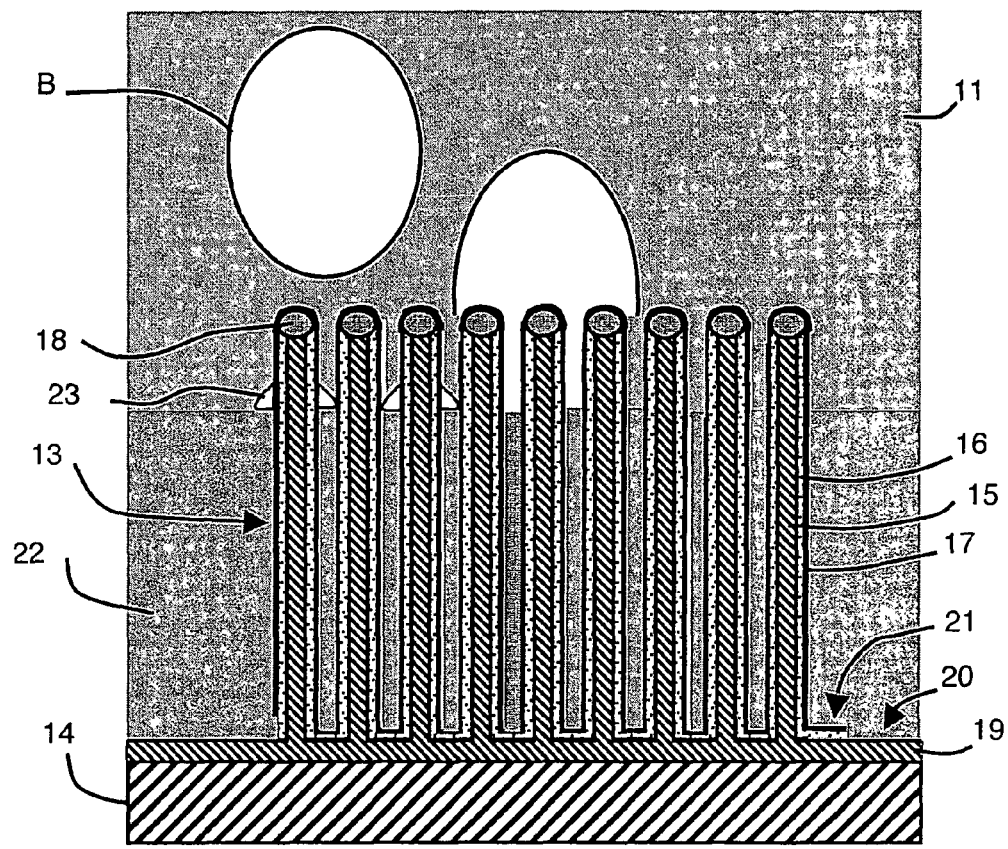
FIGS. 6 and 7 represent a detail of the bottom part of two specific embodiments of a component according to the invention.

As represented in greater detail in FIG. 6, each nanowire 13 of the converter 12 is thus formed by a core 15 the periphery of which is covered by a layer of insulating material 16 and by an envelope 17. The core 15 and the envelope 17 of a nanowire 13 are formed by different metallic materials or by semi-conducting materials of different type (for example respectively of n type and p type) and electrically connected to the free end of the nanowire 13. Each nanowire thus constitutes a thermocouple, with a central first branch formed by the core and a peripheral second branch constituted by the envelope.

Such a converter is preferably produced using a nanowire fabrication method by vapor-fluid-solid (VLS) growth (see US-A-2002/0175408 and the above-mentioned article by A. R. Abramson). This type of growth involves the use of a metallic catalyst, and throughout the growth phase of the nanowire a droplet of catalyst, for example of gold, is disposed on the top of the nanowire.

The cores 15 of the nanowires are then produced on the base substrate 14 by VLS growth. A droplet 18 of electrically conducting material which acted as catalyst during the growth step remains on the core of each nanowire, which core is preferably made from a doped semi-conducting material of a first type. This droplet 18 can be kept and used to automatically, electrically and individually connect the two branches of the corresponding nanowire.

After this growth step, the layer 16 of electrically insulating material is formed around the core 15 of each nanowire, for example by oxidation of this core at the periphery of the latter. The layer 16 does not cover the droplets 18. Then the envelope 17, preferably made from doped semi-conducting material of a second type, is formed so as to complete each nanowire, preferably by covering the layer of insulating material 16 and the droplet associated with the nanowire. This droplet 18 then interconnects the coaxial core and envelope of the corresponding nanowire individually.

In the specific embodiment of FIG. 6, the cores 15, made of n-type semi-conductor, of an array of nanowires are formed simultaneously by VLS growth on a layer of the same nature (n-doped semi-conductor) formed on the substrate 14. Two adjacent cores 15 are then electrically connected by this layer, which constitutes a base 19 substantially perpendicular to the array of nanowires 13.

The insulating layer 16 then covers not only the periphery of the cores 15, but also the base 19, at least between two adjacent cores 15. The layer of p-type semi-conducting material then covers the whole of the insulating layer 16, both around and between the cores 15, and also covers all the associated droplets 18.

This fabrication method thus enables an array of nanowires 13 to be formed collectively, for example by VLS growth, constituting thermocouples electrically connected in parallel and each formed by connection in series of a core 15, of the corresponding droplet 18 and of the associated envelope 17.

Each array of nanowires can comprise two connection terminals. A first connection terminal 20 can be formed by a zone of the base 19 salient from one side of the array (on the right in FIG. 6) and not covered by the insulating layer 10. The second connection terminal 21 can be formed by a lateral zone of the envelope 17, either on the same side as the terminal 20 (also on the right, as in FIG. 6), or on the opposite side (on the left), or on a perpendicular side. The electric connections of the array of nanowires with other arrays of nanowires or with the outside are thus transferred substantially to the level of the substrate 14, for example on one and the same side, on each side, or on perpendicular sides of the converter.

To form a thermoelectric converter, arrays of adjacent nanowires can be electrically connected in series using conventional microelectronics techniques.

The free ends of the nanowires 13 of the converter thus formed are, as indicated above, immersed in the heat conducting fluid 11 of a heat pipe 9. As represented in FIGS. 4 to 6, an electrically insulating coating material 22 of low thermal conductivity partially covering the nanowires is arranged between the base substrate 14 and the heat conducting fluid 11. This coating material 22, which impregnates the base of the nanowires 13, is preferably constituted by a polymer, for example by parylene. It performs hydraulic and thermal insulation, the heat conducting fluid only being able to reach the free top end of the nanowires. The electrical connection terminals 20 and 21, all arranged at the level of the base substrate 14, are insulated from the heat conducting fluid by the coating material.

The protuberances formed by the free ends of the nanowires constitute heat exchange surfaces immersed in the heat conducting fluid that are particularly advantageous to minimize the thermal resistance between their surface and the vapor of the heat pipe. As illustrated in FIG. 6, a very large number of nucleation sites 23 are thus created by trapping gas microbubbles or nanobubbles on the surface of the coating material, more particularly at the interface between the coating material 22, the heat conducting fluid 11 and the nanowires 13. Apparition of these microbubbles or nanobubbles is in fact enhanced by the variation of the wetting properties at the interface between the nanowires which are rather hydrophilic and the polymer which is rather hydrophobic. In addition, the increase of the hot exchange surface (constituted by the free ends of the nanowires) in the vapor bubbles enables faster growth of the bubbles and consequently a better heat exchange coefficient.

The very low thermal inertia of nanowires is also advantageous. As boiling of the heat conducting fluid in the heat pipe creates rapid temperature fluctuations on the hot surface with pseudo-periods ranging from a few tens of Hertz to a few hundred Hertz, this low inertia does in fact enable the thermocouple branches to be made to operate in non-stationary conditions. It has in fact been shown that under these operating conditions the thermal conduction phenomena in the thermocouple branches are slower than the electrical conduction phenomena. The performances obtained by the thermocouples are then better than under permanent operating conditions.

The two functions of the nanowires, i.e. constitution of thermocouples of a thermoelectric converter and heat transfer via a heat pipe, are thus simultaneously optimized.

Figure 7:
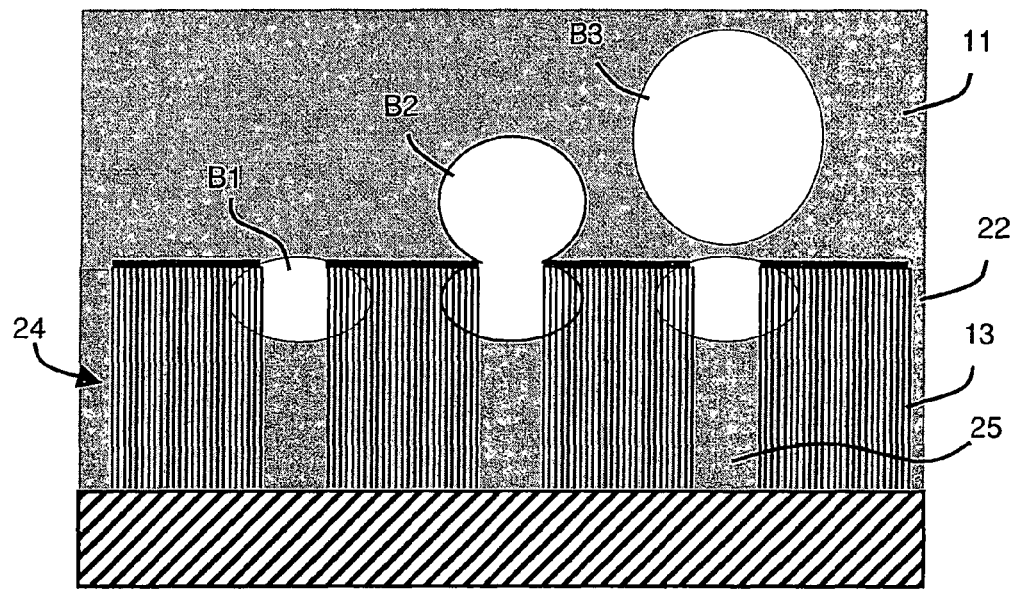

In the alternative embodiment illustrated in FIG. 7, the nanowires are grouped in adjacent packets 24 separated by gaps 25 constituting re-entrant microcavities designed to trap the microbubbles. FIG. 7 schematically illustrates, from left to right, formation of a bubble B1 in a re-entrant cavity 25, growth of a bubble B2 from a bubble trapped in a cavity and detachment of a bubble B3 which separates from the initially trapped bubble which remains in the cavity, whereas the bubble B3 rises in the heat conducting fluid 11. The heat transfer coefficients by boiling and condensation can thereby be further improved.

Figure 8:
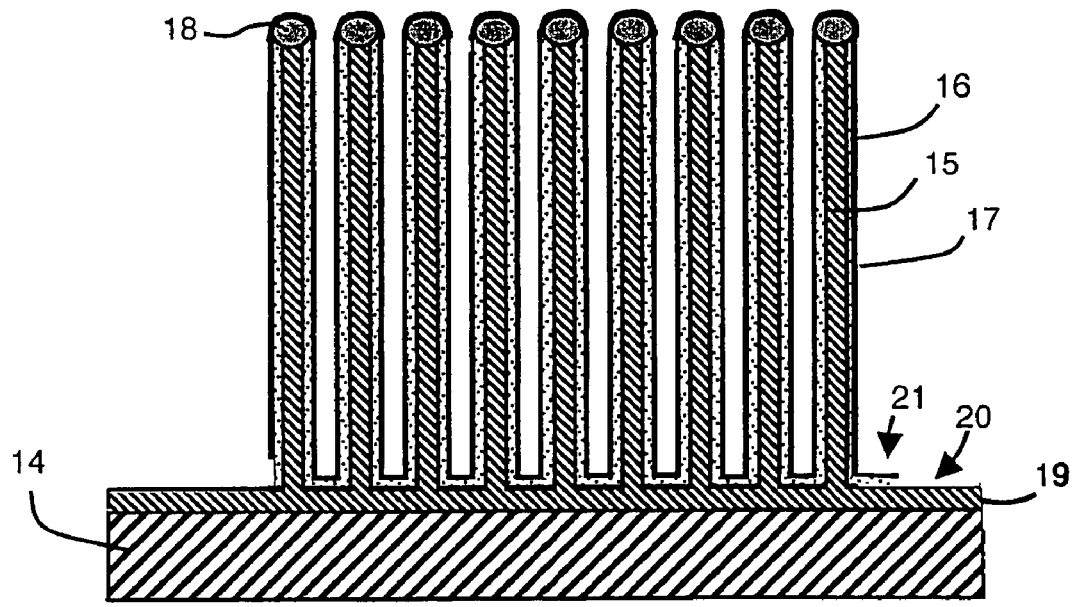
FIGS. 8 to 10 represent successive steps of a specific embodiment of a production method according to the invention.
Figure 9:
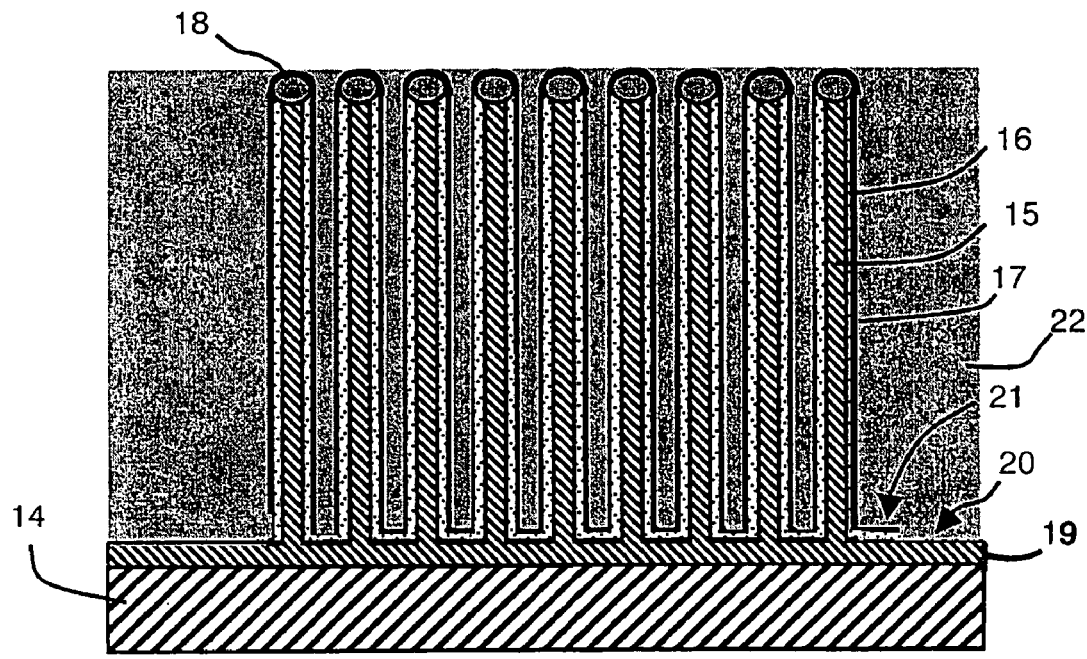
Figure 10:
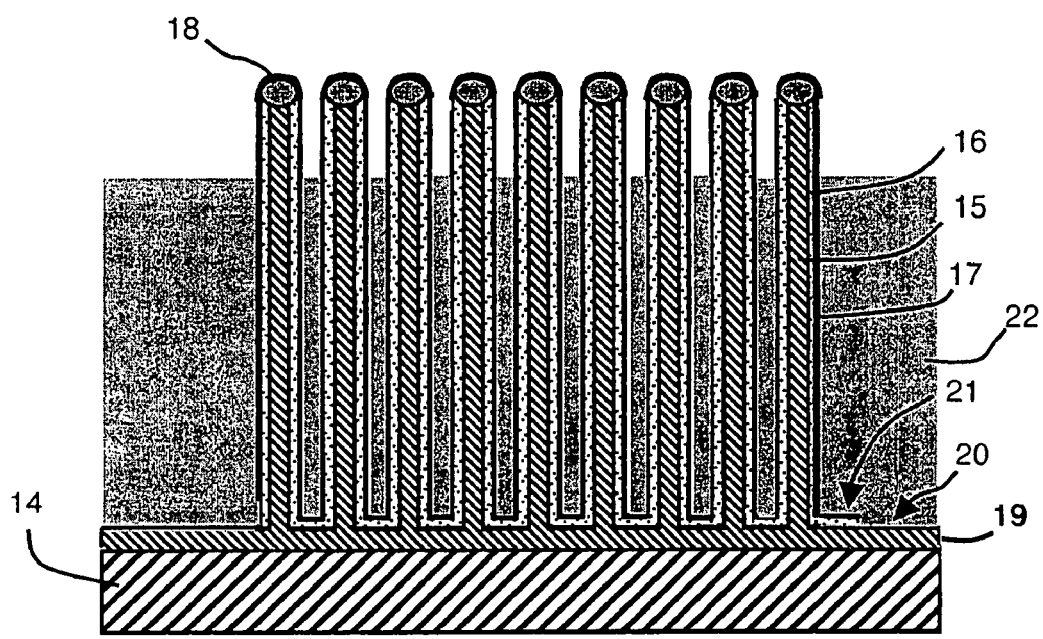

The successive steps of an example of a production method of a component are illustrated in FIGS. 8 to 10.

The converter illustrated in FIG. 8 is achieved in the manner described above with reference to FIG. 6. Then, as represented in FIG. 9, the assembly is impregnated with a polymer constituting the coating material 22, in a fluid or vapor phase, preferably with parylene in vapor phase. The top ends of the nanowires 13 are then released, as represented in FIG. 10, by etching the polymer over a certain depth to eliminate a predetermined thickness of the coating material. This etching can be performed by any suitable technique known in microelectronics, for example by plasma etching or chemical etching.

The component is then completed, as represented in FIGS. 4 to 6, by immerging the free ends of the nanowires in the heat conducting fluid 11 of a heat pipe. The component can then be used to cool a component 2 on which it is arranged. In an alternative embodiment, the base substrate 14 can be formed directly on the component to be cooled.

Figure 11:
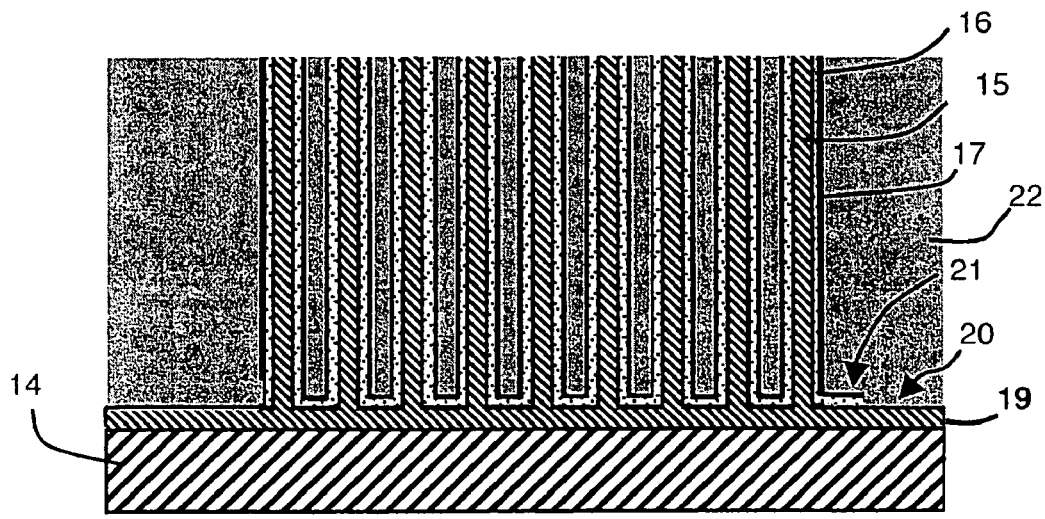
FIGS. 11 to 14 represent alternative embodiments of the method according to the invention.
Figure 12:
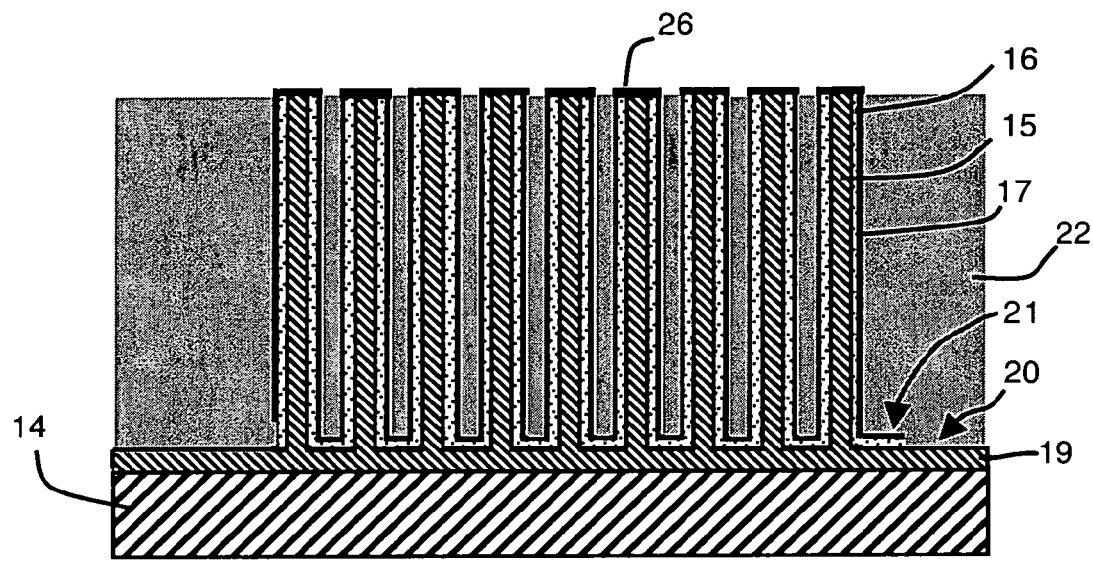

In an alternative embodiment illustrated in FIGS. 11 and 12, the production method remains unchanged up to FIG. 9. However the droplets 18 are not kept to form the individual electrical connections between the core and the envelope of the nanowires. Indeed, after the nanowires have been impregnated by the polymer (FIG. 9), a planarization step (FIG. 11) simultaneously eliminates the top part of the polymer and the top ends of the nanowires, baring the core 15, the insulating layer 16 and the envelope 17 of each nanowire at the level of the free surface of the polymer. Individual electrical junctions 26 designed to individually connect the core and the envelope of each nanowire are then made by metallization (FIG. 12), at the level of the free top surface of the polymer 22 by any conventional metallization technique.

Figure 13:
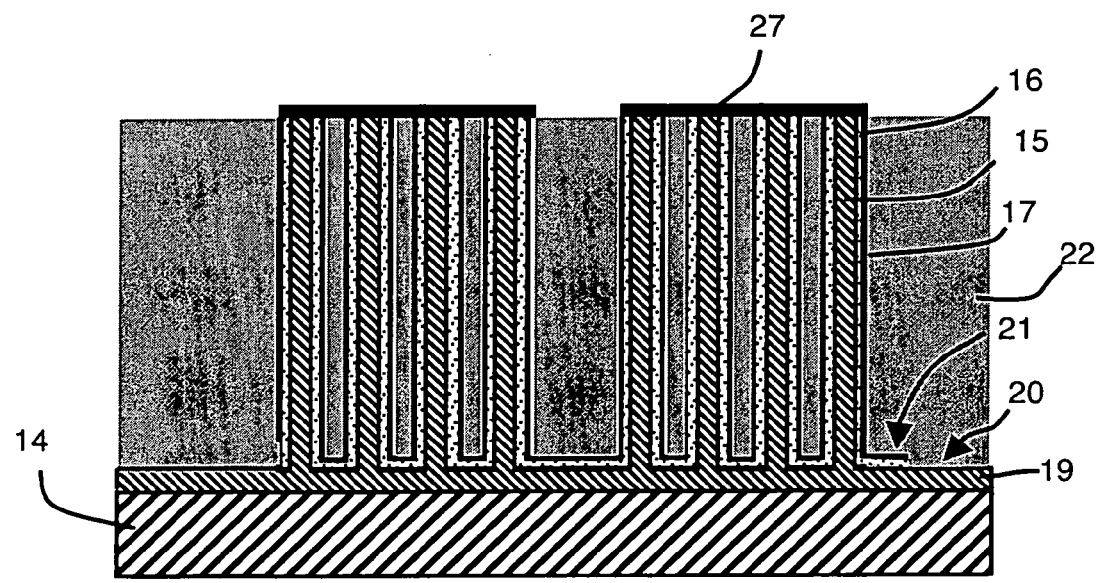

In the case where the nanowires are grouped in packets 24, as in FIG. 7, to make re-entrant cavities, the nanowires of any one packet are preferably electrically connected in parallel, whereas all the packets are connected in series. In the alternative embodiment of FIG. 13, a common electrical junction 27, also formed by metallization, then preferably electrically connects all the free ends of the nanowires of a packet, thus simultaneously forming the electrical junction between the core and the envelope of a nanowire and the parallel electrical connection of all the nanowires of a packet.

Figure 14:
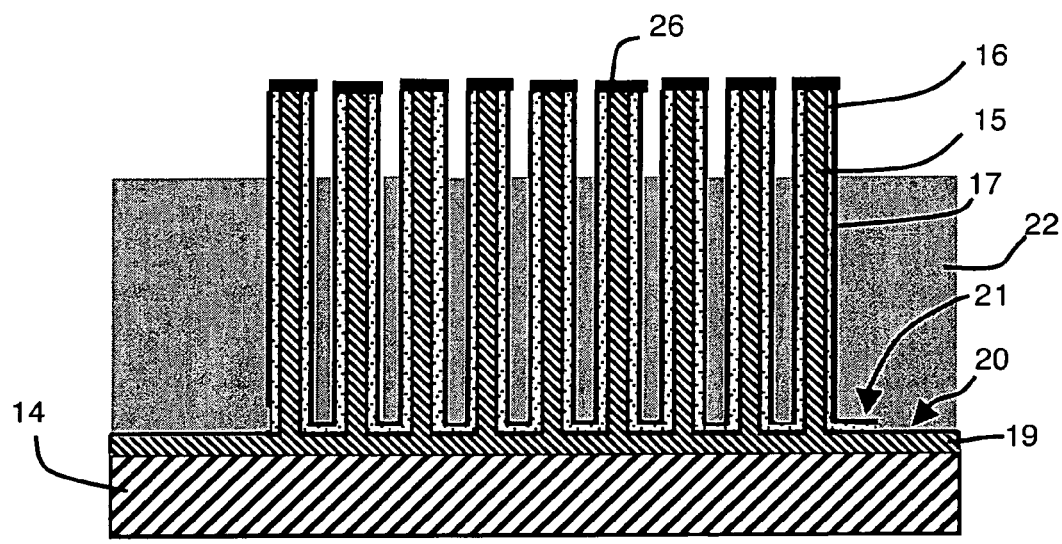

Whether the metallizations of the nanowires are individual (FIG. 12) or common to a packet (FIG. 13), fabrication continues, as in FIG. 10, by elimination of a predetermined thickness of the coating material to release the ends of the nanowires to be immersed in the heat conducting fluid of the heat pipe. The component obtained on completion of this step in the case of individual metallizations is illustrated in FIG. 14.

The protuberances created by the nanowires in the heat conducting fluid, above the coating material, typically have a height comprised between 0.01 and 100 micrometers, more particularly about 2 micrometers. In the alternative embodiment grouping the nanowires in packets, the packets 24 can have a square or rectangular cross-section with sides of 1 to 100 micrometers, more particularly about 10 micrometers, with a spacing between packets of the same order of magnitude (comprised between 1 and 100 micrometers, more particularly about 10 micrometers). The packets can advantageously be arranged regularly so as to form lines and columns in top view.

The component described above can be used both in a configuration using the Peltier effect to reject heat to the ambient air, and in a configuration using the Seebeck effect to remove heat to the ambient air.

We claim:

1. An electronic component comprising a thermoelectric converter and a heat conducting fluid, the thermoelectric converter comprising a base substrate, and a plurality of nanowires formed on the base substrate, each nanowire comprising: a free end being immersed in the heat conducting fluid, a core, an electrically insulating material surrounding the core, and an envelope of a different material than the core surrounding the electrically insulating material, the envelope forming a thermocouple with the core and being electrically connected to the core at the free end of each nanowire; the cores of two adjacent nanowires are connected by a layer of doped semi-conducting material of a first type, constituting a base substantially perpendicular to the nanowires; the layer of insulating material covers the base between two adjacent nanowires, the envelopes of two adjacent nanowires being connected, above the layer of insulating material, by a layer of doped semi-conducting material of a second type.

2. The component according to claim 1, the core wherein is made of metallic or a semi-conducting material surrounded at its periphery by the layer of insulating material and by the envelope made of different metallic or semi-conducting material of a different type, an electrical junction made of electrically conducting material individually connecting the core and the envelope of each nanowire at the free end of the latter.

3. A method for producing an electronic component with heat transfer by boiling and condensation, comprising: forming a thermoelectric converter comprising a plurality of nanowires on a base substrate, each nanowire forming a thermocouple comprised of a core, an electrically insulating material surrounding the core, and an envelope of a different material than the core surrounding the electrically insulating material, the envelope forming a thermocouple with the core and being electrically connected to the core at the free end of each nanowire; partially impregnating the nanowires by an electrically insulating coating material with a low thermal conduction; and immersing the free ends of the nanowires in a heat conducting fluid of a heat pipe.

4. The method according to claim 3, wherein
forming the thermoelectric converter successively comprises a growth step to form cores, by vapor-fluid-solid growth, on the base substrate, the cores being made of metallic or semi-conducting material;
forming the layer of electrically insulating material covering each core at the periphery of the latter; then
forming the envelopes made of a different metallic or semi-conducting material of a different type and an electrical junction made of electrically conducting material individually connecting the core and the envelope of each nanowire at the free end of the latter.

5. The method according to claim 4, wherein, a droplet of electrically conducting material that acted as catalyst during the growth step remaining on the top of the core of each nanowire at the end of the growth step, said droplet of catalyst constituting the electrical junction between the core and the envelope of said nanowire.

6. The method according to claim 3, wherein the layer of electrically insulating material is formed by oxidation of the core at the periphery of the latter.

* * * * *